United States Patent
Ogata et al.

[11] Patent Number: 5,181,097
[45] Date of Patent: Jan. 19, 1993

[54] PLASTIC MOLDED TYPE ELECTRONIC DEVICE

[75] Inventors: Masatsugu Ogata; Yasuhide Sugawara; Masanori Segawa, all of Hitachi; Hidetoshi Abe, Katsuta; Osamu Horie, Shimodate, all of Japan

[73] Assignee: Hitachi, Ltd., Tokyo, Japan

[21] Appl. No.: 611,549

[22] Filed: Nov. 13, 1990

Related U.S. Application Data

[63] Continuation-in-part of Ser. No. 364,459, Jun. 12, 1989, abandoned.

[51] Int. Cl.$^5$ .............................................. H01L 23/28
[52] U.S. Cl. .................................. 257/788; 428/413; 257/793
[58] Field of Search ............... 357/72, 74; 264/272.17; 428/413; 174/52.2

[56] References Cited

U.S. PATENT DOCUMENTS

| | | | |
|---|---|---|---|
| 4,248,920 | 2/1981 | Yoshizumi et al. | 357/72 |
| 4,367,318 | 1/1983 | Ishimura et al. | 525/481 |
| 4,596,840 | 6/1986 | Hesse et al. | 523/400 |

FOREIGN PATENT DOCUMENTS 0166275 2/1986 European Pat. Off. .
0244996 11/1987 European Pat. Off. .

Primary Examiner—Andrew J. James
Assistant Examiner—Sara W. Crane
Attorney, Agent, or Firm—Antonelli, Terry; Stout & Kraus

[57] ABSTRACT

The phenol resin molding composition used in the present invention is obtained by subjecting a resol-type phenol resin to purification until, when the resin is extracted by heating with 10 times the amount of hot water at 120° C. for 100 hours or more, the extract has an electric conductivity of 100 $\mu$S/cm or less, a pH of 4-7 and a halogen ion content of 10 ppm or less, then preparing a composition comprising a resin component consisting of said resol-type phenol resin and a cure rate controlling agent incorporated therewith, optionally incorporating a filler into said composition, kneading the resulting mixture, and then grinding the kneaded mixture. The composition has a good moldability and, when used for resin-sealing of electronic devices or semiconductor devices and transfer-molding of electronic devices using resin, exhibits an excellent adhesive property, electric properties, moisture resistance and heat resistance.

9 Claims, 2 Drawing Sheets

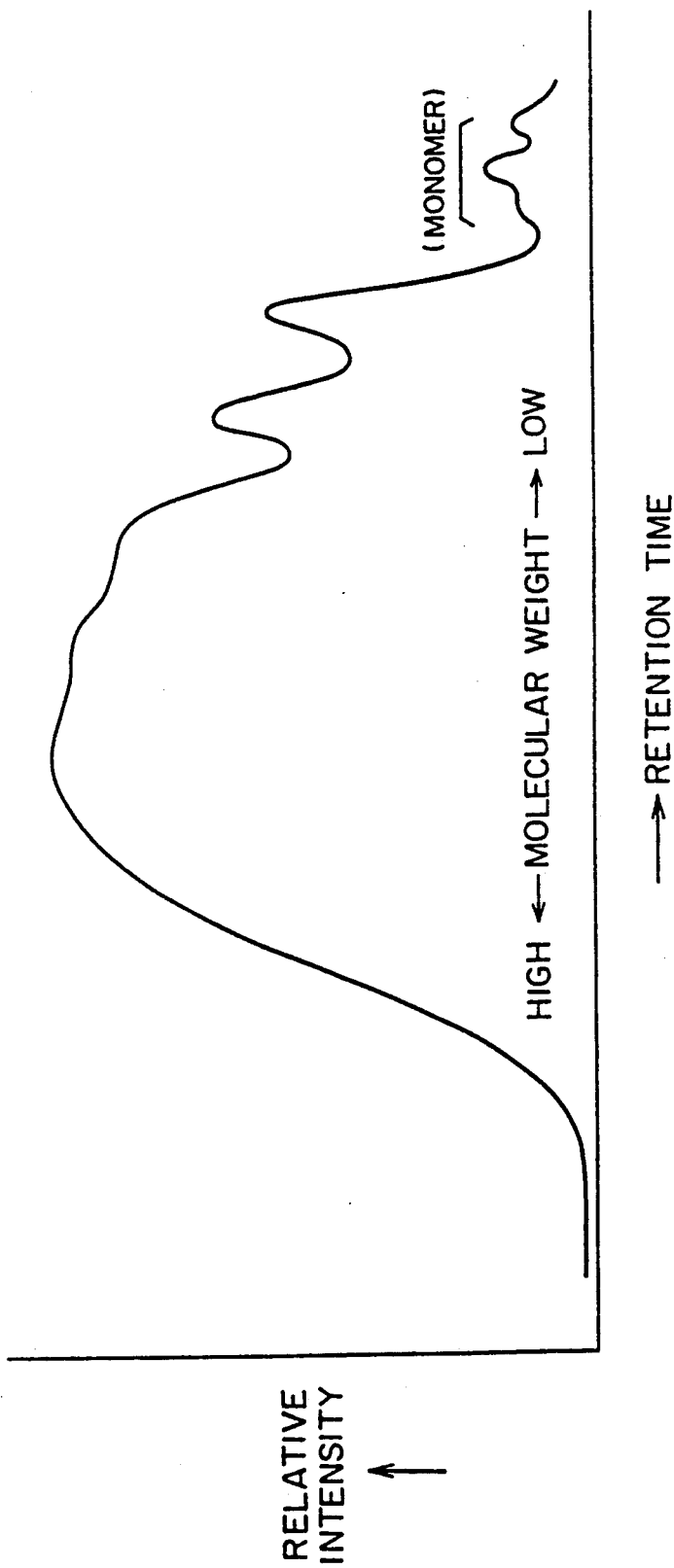

PLASTIC MOLDED TYPE ELECTRONIC DEVICE

CROSS-REFERENCE TO RELATED APPLICATIONS

This is a continuation-in-part of application Ser. No. 07/364,459, filed on Jun. 12, 1989, now abandoned.

BACKGROUND OF THE INVENTION

The present invention relates to a phenol resin molding composition of high moldability which gives cured products having excellent adhesive property, electric properties and heat resistance, and to semiconductor devices of plastic molded type sealed with said resin composition.

DESCRIPTION OF THE RELATED ART

The outer packagings of electronic devices and semiconductor devices, such as a transistor, IC, LSI and VSLI, are classified into two groups. One is the hermetic seal type which utilizes metals, glasses, ceramics etc., and the other is the plastic molded type which utilizes thermoplastic resins or thermosetting resins.

The former is superior in airtightness but is very expensive. By contrast, the latter can be produced at a very low cost by mass production. Due to the low manufacturing cost and the advance in materials and production techniques for semiconductor devices and sealing resins in recent years, 80% or more of the semiconductor products have come to be the plastic molded type semiconductors produced by transfer molding with thermosetting, resins, among which epoxy resins are mainly used.

However, the semiconductor devices are becoming more highly integrated year after year and, as a result, the industry is advancing toward a larger chip size and a finer and more multi-layered wiring. As for the shape of packages, due to the trend toward higher density and automation of packaging, the package size is becoming smaller and thinner and the shape of the package is shifting from the conventional pin insertion type package, a typical example of which is DIP (Dual Inline Package), to the surface-mounting type packages including the QFP (Quad Flat Package), SOJ (Small Outline J-bended Package) and PLSCC (Plastic Leaded Chip Carrier).

With the increase in degree of integration, the changes in size and shape of the package and mounting method, the surface of a chip becomes finer and the sealing resin layer of a package gradually becomes thinner. Moreover, with the shift from the pin insertion type to the surface-mounting type, the package has come to be exposed to higher temperatures than before during mounting. Consequently, when a sealed device is subjected to a drastic temperature change, local heating or the like, the thermal stress increases due to the difference between the thermal expansion coefficients of the constituents of semiconductor device (sealing resin, chip, frame etc.) and thereby the sealing resin, chip or passivation film formed on the chip surface is cracked or the wiring on the chip surface is broken, shorted or misregistrated. Thus are caused problems such as the fluctuation of characteristic properties of the device and the reduction of reliability thereof.

These problems become more emphasized as the mounting method for packages shifts from the pin insertion type to the surface-mounting type.

In manufacturing the conventional pin insertion type package, the pin is inserted into the through-hole of the substrate and soldered at the backside of the substrate. Accordingly, the temperature of the package mounted on the substrate is elevated to only about 100°–130° C. and hence there has scarcely arisen the problem that the reliability of the sealed product is reduced by the thermal stress experienced during mounting. In manufacturing the surface-mounting type package, on the other hand, mounting is conducted by means of infrared reflow or vapor reflow with an inert gas, whereby the whole package is exposed to an elevated temperature of 200° C. or more. Consequently, the thermal stress increases due to the differences between the thermal expansion coefficients of the constituents of the semiconductor device (sealing resin, chip, frame, etc.) and thereby the sealing resin, chip or passivation film formed on the chip surface is cracked or the wiring is broken, shorted or misregistered. Thus are caused problems such as the fluctuation of characteristic properties of the device and the reduction of reliability thereof.

Although the temperature at which plastic molded type semiconductors are usable has been generally considered to be about 125° C. at the highest, heat-resistant plastic molded type semiconductor devices usable at more elevated temperatures have come to be required as the range of use is widened. Plastic molded type semiconductors of the prior art develop defective connection at the joint between the gold wire and aluminum electrode when allowed to stand for a long time at an elevated temperature of 200° C. or more and are thus poor in so-called high-temperature life. Therefore, a material having a high heat resistance, adhesive property, low stress development, and moisture resistance has been desired for semiconductor sealing material.

As the conventional molding materials for sealing semiconductors, there have been widely used epoxy resin molding materials with a curing agent such as phenol novolak resin and acid anhydrides. However, the heat resistance of the epoxy resins are, when the glass transition temperature of cured product is taken as the measure of the heat resistance for example, 150°–180° C. and are not satisfactory for meeting the above-mentioned requirements. Nevertheless, the heat resistance alone can be considerably improved by using multi-functional epoxy resins, phenol resins of higher molecular weight, or multi-functional acid anhydrides as a curing agent.

However, the cured product of these resin compositions are not satisfactory in adhesive property, moisture resistance and electric properties and it has not been possible to use the cured products in practice as materials for electronic parts. As heat-resistant resins other than epoxy resins, for example, polyimide resin and polyphenylene sulfide (PPS) have already been known. However, as compared with epoxy resin molding materials, conventional molding materials using polyimide resin are markedly poor in curing characteristics, mold release, etc. They are also unsatisfactory in adhesion to chips and lead frames and in moisture resistance. PPS is unsatisfactory in resistance to soldering heat. Thus, these resins have not yet been applied to any practical uses as molding materials for electronic device.

The present invention has been made in view of such situations, and an object thereof is to provide a phenol resin composition of high moldability which gives cured products excellent in adhesive property, electric properties and heat resistance, and is useful particularly for electronic parts, a process for producing said composition, and semiconductor devices of the plastic molded type which utilize said composition.

SUMMARY OF THE INVENTION

According to the present invention, there are provided a phenol resin molding composition comprising a resin component consisting of a resol-type phenol resin and a modifier in a weight ratio of 30:70 to 95:5; a process for producing a resol-type phenol resin suitable for a phenol resin molding phenol resin suitable for a phenol resin molding composition in which said resin is subjected to purification until, when the purified resin is extracted by heating with 10 times the amount of hot water at 120° C. for 100 hours or more, the extract has an electric conductivity of 100 $\mu$S/cm or less, a pH of 4-7 and a halogen ion content of 10 ppm or less; a process for producing a phenol resin molding composition which comprises (A) subjecting a resol-type phenol resin to purification comprising neutralization with an acid followed by washing with water until, when the purified resin is extracted by heating with 10 times the amount of hot water at 120° C. for 100 hours or more, the extract has an electric conductivity of 100 $\mu$S/cm or less, a pH of 4-7 and a halogen ion content of 10 ppm or less, (B) preparing a composition comprising a resin component consisting of said resol-type phenol resin and a modifier (e.g. epoxy resins) incorporated therewith in a weight ratio of 30:70 to 95:5, (C) incorporating into said composition 55-80% by volume of a filler relative to the total volume of the composition, (D) kneading the resulting mixture, and (E) grinding the kneaded mixture; and a cured product obtained by curing the phenol resin composition described above.

BRIEF DESCRIPTION OF THE DRAWINGS

FIG. 3 is a gel permeation chromatograph showing the molecular weight distribution of one example of the resol-type phenol resin used in the present composition.

Figure 1:
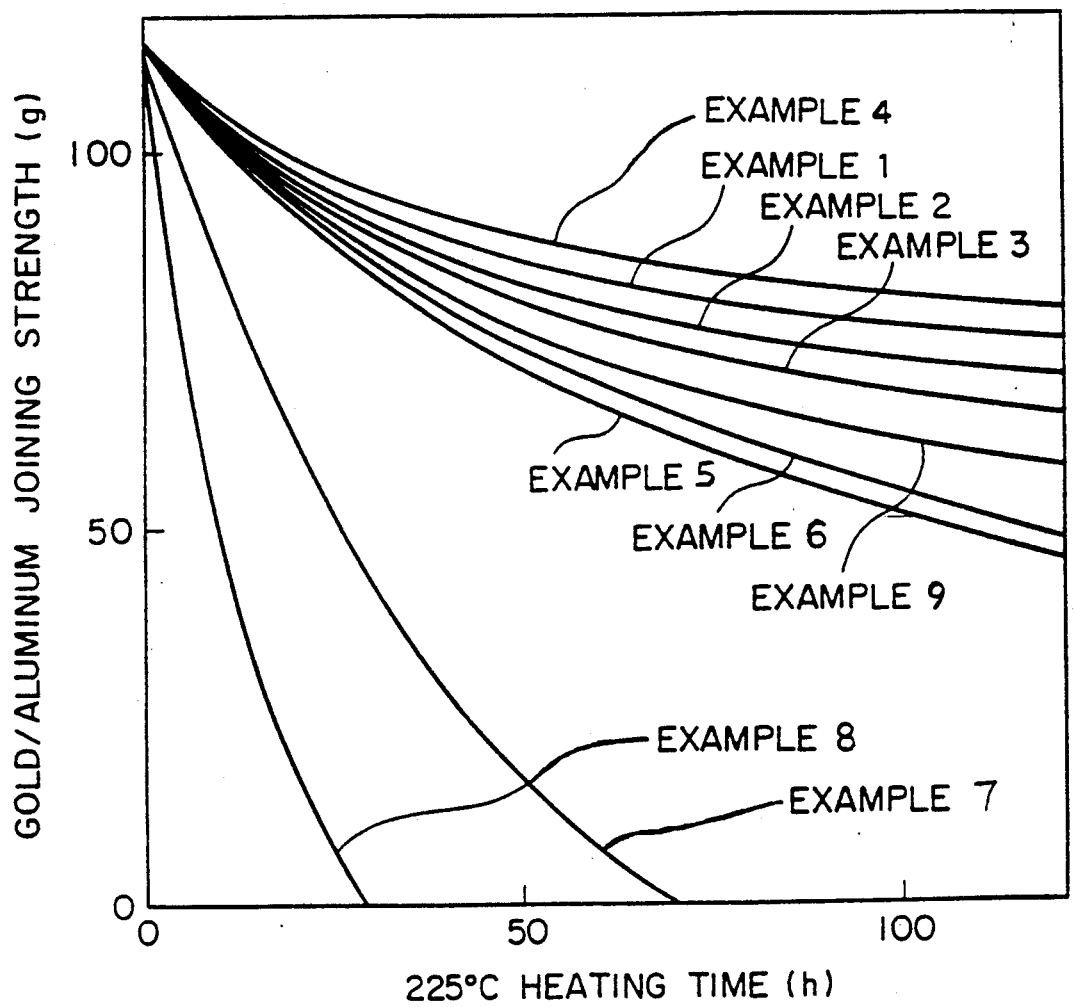
FIG. 1 is a graph showing the results of tests for examining the influences of a variety of molding materials (in the form of molded products) on the connection strength and life at an elevated temperature of the joint of gold wire with an aluminum electrode.

The numerals in the Figures mean the following. 1: silicon chip, 2: gold wire, 3: lead frame, 4: silver paste, 5: cured resin, 6: glass ampoule.

In order to solve the above-mentioned problems, the present inventors have made extensive studies on phenol resins, which had been regarded as almost practically unusable as a material for electronic parts due to their high content of ionic impurities and poor electric properties, including studies on methods for increasing the purity, improving the electric properties, and application to molding materials, of phenol resins. As a result, it has been found unexpectedly that the phenol resin composition described above has a good moldability, adhesive property, electric properties, moisture resistance and heat resistance and gives sealed products excellent in resistance to soldering heat and in the strength and life of the connection of the joint of gold wire with an aluminum electrode after standing at high temperatures for a long period of time. Thus, the present invention has been attained.

The present invention has an excellent feature of making it possible, particularly by use of a resol-type phenol resin, to attain the flame resistance V-O without incorporation of a flame retardant.

In the composition of the present invention, the resin component consisting of a resol-type phenol resin and an epoxy resin preferably has a low content of ionic impurities such that when extracted with 10 times the amount of hot water at 120° C. for 100 hours or more the extract has an electric conductivity of 100 $\mu$S/cm or less, a pH of 4-7 and a content of extracted halogen ions of 10 ppm or less. Fillers may be added as occasion demands. Although the filler is not particularly restricted, it is preferably an inorganic particulate substance. More preferably, it is at least one inorganic particulate substance selected from fused silica, crystalline silica, and alumina, each having an average particle diameter of 1-30 $\mu$m. Particularly preferred is spherical fused silica.

Since the resol-type phenol resin used in the present invention has a reactive methylol group and hydroxyl group in the molecule, principally it can be heat-cured by itself. Moreover, even when no curing agent is used, the cure rate is considerably higher than that of such thermosetting resins as epoxy resin. However, when such a fast-curing resin is used for a molding material, coating material or laminating material for electronic parts, it is difficult to mold the resin into a specified shape, or mold it without developing voids or damaging the insert, due to the excessively short flowable time of the material. Accordingly, in the present invention an epoxy resin is used together with the resol-type phenol resin in order to regulate the curing property, viscosity, flowability etc. of the resin.

The weight ratio of the resol-type phenol resin to the epoxy resin is 30:70 to 95:5, preferably 60:40 to 90:10, more preferably 70:30 to 80:20.

The reason why the proportion of the epoxy resin (a modifier) should be 5-70% by weight relative to the total resin component is that when the proportion is less than 5% by weight, the curing property, viscosity, flowability etc. of the resin cannot be regulated sufficiently, whereas when it exceeds 70% by weight the advantageous characteristics inherent to the resol-type phenol resin such as heat resistance (or high-temperature property), flame resistance, etc. are deteriorated.

The resol-type phenol resin referred to in the present invention is a resin synthesized by the condensation of a phenol such as phenol or cresol with formaldehyde in the presence of a basic catalyst such as ammonia, hexamine, amines and organic metal salts. In the reaction, it is preferable to carry out the reaction for the time long enough to reduce the amount of unreacted starting materials. It is also preferable that the molecular weight is properly large in view of the curing property and flowability of the resulting resin. Further, in order to remove the unreacted starting materials and ionic impurities, the reaction product is, after neutralized with an acid, preferably washed with water or subjected to steam distillation and then thoroughly dried under reduced pressure, or as occasion demands, treated with an ion-exchange resin, ion-exchanger or the like. The epoxy resin referred to in this invention is any molecule containing more than two epoxy groups (whether situated internally, terminally, or on cyclic structures) capable of being converted to a useful thermoset form. It is, for example, a resin obtained by the condensation of bisphenol A or a phenol novolak resin with epichlorohydrin. Also with said epoxy resin, the reaction product is preferably freed thoroughly of unreacted starting materials and ionic impurities. Since the ionic impurities contained in these resin components are of many varieties, it is difficult to specify an allowable content for each individual impurity. However, it is preferable that when the resin component is extracted with 10 times the amount of hot water at 120° C. for 100 hours or more, the extract has an electric conductivity of 100 μS/cm or less, a pH of 4–7 and a content of extracted halogen ions of 10 ppm or less.

The composition of the present invention may be incorporated with an inorganic filler with the aim of improving the thermal expansion coefficient, thermal conductivity, elastic modulus, etc. of the cured product. Usually, the filler is used in the range of 55–80% by volume, preferably 50–70% by volume, relative to the total volume of the composition. This is because when the proportion is less than 55% by volume, it is difficult to satisfactorily improve the above-mentioned properties, whereas when the proportion exceeds 80% by volume, the resulting material tends to undergo a marked increase in viscosity and decrease in flowability. The kind of inorganic fillers is not critical and various compounds can be used. For electronic part materials, however, it is preferable that thermally and chemically stable fillers are used. Specifically, at least one inorganic particulate substance selected from fused silica, crystalline silica, and alumina is more preferable. In particular, spherical fused silica is most preferable. Because it has recently come to be commercially produced in a large scale, not only has itself a small thermal expansion coefficient but also gives, when mixed with resin, a slight increase in viscosity and decrease in flowability to the product. These fillers preferably have an average particle diameter in the range of 1–30 μm. This is because when the average particle diameter is less than 1 μm, an increase in viscosity and marked decrease in flowability of the resin composition tend to occur. Whereas when it exceeds 30 μm, the resin composition is liable to undergo separation of the resin component from the filler during molding, resulting in non-uniform cured products and fluctuation of physical properties of cured products, or to show a poor capability in filling narrow crevices.

In the present composition, various additives other than those mentioned above may be used according to necessity. Such additives include curing catalysts for encouraging the setting reaction of resin, flexibility-imparting agents for increasing the toughness or decreasing the elastic modulus of the cured product, coupling agents for enhancing the adhesion of the resin component with the filler, dyes or pigments for coloring, mold release agents for improving the mold release of the cured product from the mold and flame retardants, within a range not deleterious to the object of the invention.

When the filler or the respective additives mentioned above contain a large amount of ionic impurities, the reliability of the final product is greatly reduced as is reduced in the case of the resin component. Therefore, it is preferable that, when the additive is extracted with 10 times the amount of hot water at 120° C. for 100 hours or more, the extract has an electric conductivity of 100 μS/cm or less, a pH of 4–7 and a content of extracted halogen ions of 10 ppm or less with regard to these additives either.

To reduce the adverse effect of such ionic impurities exerted on the reliability of the final products, fine particles of an ion-exchange resin or an ion-exchanger may also be incorporated directly to the resin composition. Particularly preferable are the so-called inorganic ion-exchangers such as hydroxide and hydrated oxide of antimony or bismuth, phosphorus antimonic acid, zirconium antimonate, titanium antimonate, tin antimonate, chromium antimonate, and tantalum antimonate. Fine particles of direct ion-exchange resins or ion-exchangers may be incorporated in a proportion of 5 parts by weight or less, preferably in the range of 0.015 parts by weight, more preferably 0.1–1 part by weight relative to 100 parts by weight of the resin composition. Thereby a remarkable improvement can be obtained in preventing corrosion and breaking of aluminum wiring and electrodes in the moisture resistance test for plastic molded type semiconductors, and in preventing defective connection at the gold wire-aluminum electrode joint in the high-temperature standing test for plastic molded type semiconductors.

The epoxy-modified phenol resin of the present invention is assumed to exhibit desirable electric and other properties as compared with prior molding resins attributable to the removal of ionic impurities attained by high degree of purification. The success in attaining the flame resistance V-0 is assumed to be due to the phenol resin component itself.

PREFERRED EMBODIMENT

The methods of preparation and purification o resol-type phenol resin used in the present composition is shown below by way of one example.

Preparation Example 1

Synthesis of resol-type phenol resin

In a 3-liter flask were placed 500 g of phenol, 550 g of 30% formalin and 25 g of 25% aqueous ammonia solution, and the resulting mixture was gradually heated with stirring and then heated under reflux at 90° C. for 60 minutes. The inner pressure of the flask was then reduced to 20 mmHg to remove condensation water and unreacted components.

Then, 500 g of the reaction product was placed in another 3-liter flask, 1 liter of deionized water was added thereto, and the mixture was stirred vigorously at 90° C. for 15 minutes.

After cooling, the upper, aqueous layer was removed, 1 liter of deionized water was again added to the remaining lower layer, and the mixture was stirred vigorously at 70° C. for 15 minutes, then cooled, and the upper, aqueous layer was removed.

After the above operation had been repeated 5 times, the reaction product was heated up to 90° C. under reduced pressure to remove water, whereby an intended resol-type phenol resin was obtained.

The melting point and curing characteristic of the resol-type phenol resin obtained above are shown in Table 1. Further, 50 g of deionized water was added to 5 g of the resol-type phenol resin and heated at 120° C. for 120 hours. The pH and electric conductivity of the water after said heating and the result of analysis of extracted ionic impurities by ion exchange chromatography are also shown in Table 1.

TABLE 1

| | |
|---|---|
| Softening point (°C.) | 65 |
| Gellation time (min), 170° C. | 35 |
| Properties of extract (after 120 hr/120° C.) | |
| pH | 6.0 |

TABLE 1-continued

| | |
|---|---|
| Electric conductivity ($\mu$S/cm) | 30 |
| Cl$^-$ (ppm)* | 10 |
| Br$^-$ (ppm)* | <1 |

Note
*Calculated in terms of concentration in resin

Further, the molecular weight distribution was determined by gel permeation chromatography. The result is shown in FIG. 3 as a graph which relates the retention time (as abscissa) with the relative intensity (as ordinate).

These results reveal that the purified resol-type phenol resin contains only a very small amount of ionic impurities.

Further, it is apparent from FIG. 3 that the reaction product comprises mainly multinuclear components of two, three or more nuclei and contains little of the unreacted low molecular weight components.

The present invention will be described further in detail below with reference to the following Examples.

EXAMPLES 1-3

Molding materials were prepared by using, in mixing ratios shown in Table 2 later, a resol-type phenol resin purified by the above-mentioned method and a bisphenol A-type epoxy resin as the resin component, spherical fused silica having an average particle diameter of 15 $\mu$m as the filler, epoxysilane as the coupling agent, montanic acid ester wax as the mold release agent, and carbon black as the coloring agent. The respective starting materials were kneaded by using a two-axle roll at a roll surface temperature of about 60-75° C. for about 10 minutes.

EXAMPLES 4-6

Three kinds of molding materials were prepared in the same manner as described above and by using the same starting materials as in the above Examples in mixing ratios shown in Table 2.

EXAMPLE 7

A molding material of the same mixing ratio as in Example 2 as shown in Table 2 was prepared by using as the resin component an unpurified resol-type phenol resin (softening point: 60° C.; gellation time: 30 sec; pH, electric conductivity, and extracted Cl ion content of aqueous extract after 120 hours of extraction at 120° C.: respectively 9.5, 4500 $\mu$S/cm and 1540 ppm).

EXAMPLE 8

A molding material was prepared by kneading 90 parts by weight of an o-cresol novolak-type epoxy resin (epoxy equivalent: 195, softening point: 75-80° C.) and 10 parts by weight of a brominated bisphenol A-type epoxy resin (epoxy equivalent: 394, softening point: 65° C.) as the resin component, 55 parts by weight of a phenol novolak resin (hydroxyl equivalent: 106, curing temperature: 65° C.) as the curing agent, 1.0 part by weight of triphenylphosphine as the cure accelerator, 470 parts by weight of fused silica having an average particle diameter of 15 $\mu$m as the filler, 10 parts by weight of antimony trioxide as the flame retarding assistant, 3.0 parts by weight of epoxysilane as the coupling agent, 1.0 part by weight of montanic acid ester wax as the mold release agent, and 1.0 part by weight of carbon black as the coloring agent, with a two-axle roll in the same manner as in the above Example.

EXAMPLE 9

A non-flame resistant type epoxy resin molding material was prepared by kneading 100 parts by weight of an o-cresol novolak-type epoxy resin (epoxy equivalent: 195, softening point: 75°-80° C.) as the resin component, 58 parts by weight of a phenol novolak resin (hydroxyl equivalent: 106, softening point: 65° C.) as the curing agent, 1.0 part by weight of triphenylphosphine as the cure accelerator, 480 parts by weight of spherical fused silica having an average particle diameter of 15 $\mu$m as the filler, 3.0 parts by weight of epoxysilane as the coupling agent, 1.0 part by weight of montanic acid ester wax as the mold release agent, and 1.0 part by weight of carbon black as the coloring agent, with a two-axle roll in the same manner as the above Example.

Each of the molding materials thus obtained was examined for its moldability at 170° C. Separately, it was molded at a mold temperature of 170° C., molding pressure of 70 kg/cm$^2$ and a molding time of 90 sec and then post-cured at 180° C. for 15 hours. The molded product was examined for its various properties. Further, the molded product was ground to pass through a 100-mesh screen, then 50 g of deionized water was added to 5 g of the resulting powder, the mixture was heated at 120° C. for 120 hours, and the resulting water was examined for pH and electric conductivity and analyzed for ionic impurities extracted. The results of these tests are collectively shown in Table 2. The adhesive property in the Table refers to the value obtained by sealing the tip of a 42 alloy specimen 0.25 mm thick and 5 mm wide with each molding material (sealed part: 10 mm) and subjecting the specimen to a drawing test.

TABLE 2

| | Item | | | | |
|---|---|---|---|---|---|
| | Example 4 | Example 1 | Example 2 | Example 3 | Example 5 |
| Composition (part by weight) | | | | | |
| Resol-type phenol resin | 100 | 90 | 80 | 75 | 70 |
| Epoxy resin | 0 | 10 | 20 | 25 | 30 |
| Filler | 300** | 300 | 300 | 300 | 300 |
| Coupling agent | 2 | 2 | 2 | 2 | 2 |
| Mold release agent | 1 | 1 | 1 | 1 | 1 |
| Coloring agent | 1 | 1 | 1 | 1 | 1 |
| Moldability | | | | | |
| Melt viscosity (P) | 2500 | 600 | 350 | 310 | 205 |
| Spiral flow (inch) | 3 | 32 | 50 | 56 | 60 |
| Gellation time (sec) | 15 | 18 | 23 | 25 | 25 |
| Properties of cured product | | | | | |
| Glass transition temp. (°C.) | 250 | 235 | 230 | 220 | 210 |

TABLE 2-continued

| | | | | | | |
|---|---|---|---|---|---|---|
| Linear expansion coefficient ($10^{-5}$/°C.) | | 1.5 | 1.6 | 1.6 | 1.6 | 1.7 |
| Bending strength | Room temp. | 20 | 19 | 18 | 19 | 18 |
| (kg/mm$^2$) | 250° C. | 4.5 | 2.5 | 3.2 | 3.0 | 2.0 |
| Flame resistance (UL-94, 1.6 mmt specimen) | | V-0 | V-0 | V-0 | V-0 | V-1 |
| Extract | pH | 6.0 | 5.8 | 5.6 | 5.5 | 5.5 |
| properties | Conductivity (μS/cm) | 60 | 68 | 70 | 76 | 72 |
| (120 h/120° C.) | Cl (ppm) | <1 | 2 | 5 | 4 | 6 |
| | Br (ppm) | <1 | <1 | <1 | <1 | <1 |
| Adhesive property (kg/mm$^2$)*** | | 0.3 | 1.2 | 1.5 | 1.5 | 1.6 |

| | | Item | | | |
|---|---|---|---|---|---|
| | | Example 6 | Example 7 | Example 8 | Example 9 |
| Composition (part by weight) | | | | | |
| Resol-type phenol resin | | 60 | 80* | Described in the text | |
| Epoxy resin | | 40 | 20 | | |
| Filler | | 300 | 300 | | |
| Coupling agent | | 2 | 2 | | |
| Mold release agent | | 1 | 1 | | |
| Coloring agent | | 1 | 1 | | |
| Moldability | | | | | |
| Melt viscosity (P) | | 115 | 515 | 200 | 240 |
| Spiral flow (inch) | | 90 | 28 | 40 | 38 |
| Gellation time (sec) | | 40 | 19 | 25 | 25 |
| Properties of cured product | | | | | |
| Glass transition temp. (°C.) | | 180 | 230 | 170 | 170 |
| Linear expansion coefficient ($10^{-5}$/°C.) | | 1.8 | 1.6 | 2.0 | 1.9 |
| Bending strength | Room temp. | 14 | 18 | 13 | 12 |
| (kg/mm$^2$) | 250° C. | 1.0 | 3.4 | 0.8 | 0.7 |
| Flame resistance (UL-94, 1.6 mmt specimen) | | HB | V-0 | V-0 | HB |
| Extract | pH | 4.8 | 8.8 | 4.5 | 4.5 |
| properties | Conductivity (μS/cm) | 75 | 1500 | 120 | 80 |
| (120 h/120° C.) | Cl (ppm) | 10 | 500 | 15 | 12 |
| | Br (ppm) | <1 | <1 | 20 | <1 |
| Adhesive property (kg/mm$^2$)*** | | 1.4 | 1.3 | 0.8 | 0.9 |

Note
*Unpurified resol-type phenol resin was used.
**Corresponding to about 62% by volume
***In terms of drawing strength of realed product (sealed part: 10 mm) of 42 alloy specimen (0.25 mm thick, 5 mm wide)

Further, the following test was made to reveal the influence the molding material of the present invention exerted, when the material is used for electronic parts, on the corrosion and the connection reliability of the aluminum electrode and the gold wire-aluminum electrode joint of semiconductor devices. As shown in FIG. 2, each of the various molded articles was placed together with a bare element to which a gold wire had been bonded in a glass ampoule having an inner diameter of 30 mm and a length of 150 mm, then the whole was heated at 230° C., and the change of the joining strength of gold with aluminum with the elapse of time during heating was determined. The results obtained are shown in FIG. 1.

Figure 2:
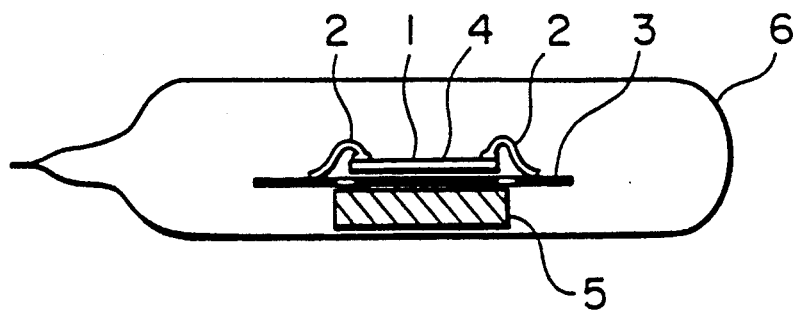
FIG. 2 is a schematic cross-sectional view of a test apparatus used in the tests of FIG. 1.

Thus, FIG. 1 is a graph showing the influences of a variety of molding materials (in the form of molded products) on the connection reliability at high temperature of the gold wire - aluminum electrode joint in terms of a relation between the heating time at 225° C. (hours, as abscissa) and the gold/aluminum joining strength (g, as ordinate).

FIG. 2 is a schematic cross-sectional view of the test apparatus and the specimen used in the test method of FIG. 1. In FIG. 2, numeral 1 denotes a silicon chip, 2 gold wire, 3 lead frame, 4 silver paste (adhesive agent), 5 cured resin (molded product) and 6 glass ampoule.

As is apparent from Table 2, while the molding material of Example 4, in which resol-type phenol resin is singly used as the resin component, has a high melt viscosity and very poor moldability, the molding materials of Examples 1 to 3 of the present invention, which contain epoxy resin compounded therein, not only have a good moldability but also show good high-temperature properties (glass transition temperature and bending strength) as molded products. However, when the amount of compounded epoxy resin is increased as shown in Examples 5 and 6, the high-temperature properties of the molded product deteriorate as in the epoxy resin molding materials shown in Examples 8 and 9, and further the flame resistance of the molded product lowers and becomes unable to attain the flame resistance grade V-0 of the UL standards. Further, the properties of extracts determined with pulverized molded products show that when the resol-type phenol resin is used after purification, the pH shows neutrality to weak acidity, electric conductivity is low, and the amount of extracted halogen ions is also low. The adhesive property to 42 alloy is also substantially good as compared with prior epoxy resin molding materials.

FIG. 1 shows one of the most important features of the present invention. It is apparent from FIG. 1 that the molded product according to the present invention gives only an extremely little influence on the corrosion of the aluminum electrode and the connection reliability of the gold wire-aluminum joint. Such phenomena of corrosion or deterioration of reliability are generally considered to be due to the effect of the thermal decomposition product of a brominated compound incorporated into a molding material as a flame retardant. This is evidenced from the comparison of Example 8 with Example 9. The molding material of the present invention can be highly flame resistant without incorporation of such a flame retardant and thus exhibits excellent characteristic properties as described above.

EXAMPLE 10

Semiconductor devices were sealed by using each of the molding materials obtained above and the various reliabilities were evaluated. The semiconductor device used had an aluminum wiring on the surface, and a chip 6×8 mm square in size was adhered to the tab of a lead frame with silver paste, the aluminum electrode on the chip and the lead frame being connected electrically with gold wire. The package was 15×20 mm in size and 2 mm in thickness, and the semiconductor device was sealed so as to be situated around the center of the package. Sealing was conducted with a transfer molding machine. Molding was carried out under conditions of a mold temperature of 170° C., molding pressure of 70 kg/cm$^2$ and molding time of 1.5 minutes. The molded products were thereafter post-cured at 170° C. for 15 hours. Then the sealed products thus obtained were subjected to a pressure cooker test (PCP) at 121° C. and 2 atm. to examine the time which elapsed until the development of corrosion and defect of aluminum wiring. Further, the sealed products were allowed to stand in a high-temperature bath at 225° C. to examine the time which elapsed until the development of defective connection at the joint of gold wire with aluminum wiring. Further, the sealed products were allowed to stand at 65° C. and at a relative humidity of 95% for 168 hours and then heated in a vapor reflow bath at 215° C. for 150 seconds to examine the development of package cracks. The results of these tests are collectively shown in Table 3.

It is apparent from Tables 2 and 3 that the respective properties examined of the molded product of the present invention are highly excellent as compared with those of the prior art products.

EXAMPLES 11 AND 12

Molding materials were prepared by using, relative to 100 parts by weight of the resol-type phenol resin prepared in Preparation Example 1 described above used as the resin component, an inorganic ion exchanger of antimony type (IXE-300, mfd. by Togosei Chemical Industry Co., Ltd.), of bismuth type (IXE-500, ditto), or of the binary mixture type of the two (IXE-600, ditto) as the ion exchanger, spherical fused silica having an average particle size of 15 μm as the filler, montanic acid ester wax as the mold release agent, and carbon black as the coloring agent respectively in the mixing ratios shown in Table 4. The respective starting materials were kneaded by using two-axle roll 20 inches in diameter at a roll surface temperature of about 60° C. for about 10 minutes.

EXAMPLE 13

A molding material was prepared in the same manner as in Example 11 but with incorporation of 20 parts by weight of epoxy resin and without incorporation of the ionic impurity-uptaking agent.

EXAMPLE 14

A molding material was prepared by using a conventional unpurified resol-type phenol resin (aqueous extract after 120 hours of extraction at 120° C. showed a pH of 9.5, electric conductivity of 4500 μS/cm and extracted Cl ion content of 1540 ppm) and according to the compounding ratio shown in Table 4.

A variety of tests were made in the same manner as in Tables 1 to 3 with the molding materials of Examples 11 to 14 described above. The results of the tests are collectively shown in Table 4.

TABLE 3

| | | Example 4 | Example 1 | Example 2 | Example 3 | Example 5 |
|---|---|---|---|---|---|---|
| Development rate of corrosion defect of aluminum wiring*[1] | After 300 h | Sample preparation was impossible owing to breaking of gold wire during molding. | 0/10 | 0/10 | 0/10 | 0/10 |
| | After 500 h | | 0/10 | 0/10 | 0/10 | 0/10 |
| | After 1000 h | | 5/10 | 3/10 | 2/10 | 6/10 |
| | After 2000 h | | 10/10 | 10/10 | 7/10 | 10/10 |
| Development rate of defective connection at gold/aluminum joint*[2] | After 50 h | | 0/10 | 0/10 | 0/10 | 0/10 |
| | After 100 h | | 0/10 | 0/10 | 0/10 | 0/10 |
| | After 200 h | | 2/10 | 0/10 | 0/10 | 1/10 |
| | After 500 h | | 10/10 | 10/10 | 6/10 | 10/10 |
| Crack development rate of humidified package in reflow*[3] | | 0/10 | 0/10 | 0/10 | 0/10 | 0/10 |

| | | Example 6 | Example 7 | Example 8 | Example 9 |
|---|---|---|---|---|---|
| Development rate of corrosion defect of aluminum wiring*[1] | After 300 h | 0/10 | 5/10 | 0/10 | 0/10 |
| | After 500 h | 3/10 | 10/10 | 1/10 | 0/10 |
| | After 1000 h | 10/10 | — | 8/10 | 3/10 |
| | After 2000 h | — | — | 10/10 | 10/10 |
| Development rate of defective connection at gold/aluminum joint*[2] | After 50 h | 0/10 | 1/10 | 8/10 | 0/10 |
| | After 100 h | 1/10 | 7/10 | 10/10 | 0/10 |
| | After 200 h | 4/10 | 10/10 | — | 2/10 |
| | After 500 h | 10/10 | — | — | 10/10 |
| Crack development rate of humidified package in reflow*[3] | | 2/10 | 0/10 | 10/10 | 10/10 |

TABLE 4

| | Example 10 | Example 11 | Example 12 | Example 13 | Example 14 |
|---|---|---|---|---|---|
| Composition (part by weight) | | | | | |
| Purified resol-type phenol resin | 80 | 80 | 80 | 80 | — |
| Unpurified resol-type phenol resin | — | — | — | — | 80 |
| Epoxy resin | 20 | 20 | 20 | 20 | 20 |
| Inorganic ion exchanger IXE-300 | 5 | — | — | — | 5 |
| Inorganic ion exchanger IXE-500 | — | 5 | — | — | — |

TABLE 4-continued

| Item | Example 10 | Example 11 | Example 12 | Example 13 | Example 14 |
|---|---|---|---|---|---|
| Inorganic ion exchanger IXE-600 | — | — | 5 | — | — |
| Fused silica | 300 | 300 | 300 | 300 | 300 |
| Coupling agent | 2 | 2 | 2 | 2 | 2 |
| Mold release agent | 2 | 2 | 2 | 2 | 2 |
| Coloring agent | 1 | 1 | 1 | 1 | 1 |
| Moldability | | | | | |
| melt viscosity (P) | 300 | 320 | 315 | 305 | 175 |
| Spiral flow (inch) | 33 | 30 | 32 | 33 | 58 |
| Gellation time (sec) | 18 | 17 | 18 | 17 | 17 |
| Properties of cured product | | | | | |
| Glass transition temp. (°C.) | 230 | 232 | 228 | 230 | 235 |
| Linear expansion coefficient ($10^{-5}$/°C.) | 1.5 | 1.6 | 1.5 | 1.6 | 1.6 |
| Bending strength (kg/mm$^2$) Room temp. | 20 | 20 | 19 | 20 | 19 |
| 250° C. | 3.6 | 3.5 | 3.5 | 3.4 | 3.4 |
| Flame resistance (UL-94, 1.6 mmt specimen) | V-0 | V-0 | V-0 | V-0 | V-0 |
| Adhesive property (kg/mm$^2$) | 1.6 | 1.5 | 1.6 | 1.5 | 1.3 |
| Extract properties (120 h/120° C.) pH | 5.0 | 4.8 | 5.2 | 6.2 | 8.2 |
| Conductivity (μS/cm) | 55 | 63 | 60 | 125 | 650 |
| Cl$^-$ (ppm) | <1 | <1 | <1 | <1 | 45 |
| Br$^-$ (ppm) | <1 | <1 | <1 | <1 | 25 |
| NH$_4^+$ (ppm) | 5 | 6 | 5 | 25 | 135 |

As described above, the resin composition of the present invention is useful as a molding material for electronic parts for which an excellent heat resistance, flame resistance and electric properties and a low ionic impurity content are required.

Further, the plastic molded type semiconductor device of the present invention is excellent in such properties as moisture resistance reliability, connection reliability of the gold wire - aluminum joint, and crack resistance of a package which has been solder-mounted in a humidified state. Thus, the present invention can provide highly reliable semiconductor devices.

What is claimed is:

1. A plastic molded type electronic device, wherein the device is sealed with a phenolic resin molding composition comprising a resin component consisting of a resol-type phenol resin and at least one epoxy resin in a weight ratio of from 75:25 to 95:5, the resin component having been purified until it gives, when extracted by heating with 10 times the amount of hot water at 120° C. for 100 hours or more, an extract having an electric conductivity of 100 μS/cm or less, a pH of 4-7 and a halogen ion content of 10 ppm or less.

2. The device of claim 1, wherein the phenolic resin molding composition further comprises 55-80% by volume of an inorganic filler relative to the total volume of the composition.

3. The device of claim 2, wherein the inorganic filler is at least one member selected from the group consisting of fused silica, crystalline silica, and alumina, each having an average particle diameter of 4. A plastic molded type electronic device, wherein the device is transfer-molded with a phenolic resin molding composition comprising a resin component consisting of a resol-type phenol resin and a modifier in a weight ratio of from 75:25 to 95:5, the resin component having been purified until it gives, when extracted by heating with 10 times the amount of hot water at 120° C. for 100 hours or more, an extract having an electric conductivity of 100 μS/cm or less, a pH of 4-7 and a halogen ion content of 10 ppm or less.

5. A plastic molded type electronic device according to claim 1, wherein said electronic device is a semiconductor device and includes an aluminum electrode and a gold wire joined to said aluminum electrode.

6. The device of claim 4, wherein the phenolic resin molding composition further comprises 55-80% by volume of an inorganic filler relative to the total volume of the composition.

7. The device of claim 6, wherein the inorganic filler is at least one member selected from the group consisting of fused silica, crystalline silica, and alumina, each having an average particle diameter of 1-30 μm.

8. The device of claim 6, wherein said phenolic resin molding composition consists essentially of said resin component and said inorganic filler and wherein said phenolic resin molding composition has a flame resistance grade V - O.

9. The device of claim 2 wherein said phenolic resin molding composition consists essentially of said resin component and said inorganic filler and wherein said phenolic resin molding composition has a flame resistance grade V - O.

* * * * *